United States Patent
Park et al.

(10) Patent No.: US 9,291,693 B2
(45) Date of Patent: Mar. 22, 2016

(54) MAGNETIC RESONANCE IMAGING APPARATUS AND CONTROL METHOD THEREOF

(71) Applicants: SAMSUNG ELECTRONICS CO., LTD., Suwon-si (KR); KOREA ADVANCED INSTITUTE OF SCIENCE AND TECHNOLOGY, Daejeon (KR)

(72) Inventors: Hyun Wook Park, Daejeon (KR); Ye Ji Han, Daejeon (KR)

(73) Assignees: SAMSUNG ELECTRONICS CO., LTD., Suwon-si (KR); KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 673 days.

(21) Appl. No.: 13/672,289

(22) Filed: Nov. 8, 2012

(65) Prior Publication Data

US 2013/0113483 A1    May 9, 2013

(30) Foreign Application Priority Data

Nov. 8, 2011  (KR) .......................... 10-2011-0116116

(51) Int. Cl.
*G01V 3/00* (2006.01)
*G01R 33/565* (2006.01)
(Continued)

(52) U.S. Cl.
CPC ...... *G01R 33/56527* (2013.01); *G01R 33/4828* (2013.01); *G01R 33/5607* (2013.01)

(58) Field of Classification Search
CPC .................................................. G01R 33/56527
USPC ........................................................... 324/309
See application file for complete search history.

(56) References Cited

U.S. PATENT DOCUMENTS 5,159,550 A * 10/1992 Sakamoto et al. ............. 600/410
5,677,626 A * 10/1997 Miyazaki et al. ............. 324/307
(Continued)

FOREIGN PATENT DOCUMENTS

| CN | 101574258 A | 11/2009 |
|----|-------------|---------|
| CN | 102188245 A | 9/2011 |

(Continued)

OTHER PUBLICATIONS

Communication dated Jun. 11, 2013 issued by the Korean Intellectual Property Office in counterpart Korean Patent Application No. 10-2011-0116116.
(Continued)

*Primary Examiner* — Rodney Fuller
(74) *Attorney, Agent, or Firm* — Sughrue Mion, PLLC

(57) ABSTRACT

The magnetic resonance imaging apparatus includes a main magnet to generate a static magnetic field in an imaging region, a gradient coil assembly to form a gradient in the static magnetic field, a radio frequency (RF) coil assembly to apply a first RF pulse and second RF pulse with respect to n (n≥2) slice regions located at different positions in the imaging region, to excite atomic nuclei of the slice regions, and a controller to control the RF coil assembly to apply a first RF pulse and second RF pulse having a first center frequency $f_0$ to a first slice and to apply a first RF pulse having a second center frequency $f_0+f_{s1}$ and a second RF pulse having a third center frequency $f_0-f_{s1}$ to a second slice.

18 Claims, 12 Drawing Sheets

(51) Int. Cl.
*G01R 33/48* (2006.01)
*G01R 33/56* (2006.01)

(56) References Cited

U.S. PATENT DOCUMENTS

| | | | |
|---|---|---|---|
| 6,288,543 B1 * | 9/2001 | Listerud et al. | 324/309 |
| 6,541,971 B1 * | 4/2003 | Dannels | 324/309 |
| 7,482,805 B2 * | 1/2009 | Feiweier | 324/307 |
| 2007/0120565 A1 * | 5/2007 | Iwadate et al. | 324/318 |
| 2008/0297153 A1 * | 12/2008 | Nozaki | 324/309 |
| 2010/0026296 A1 * | 2/2010 | Hirata et al. | 324/309 |
| 2013/0057280 A1 * | 3/2013 | Feiweier | 324/309 |
| 2013/0265049 A1 * | 10/2013 | Fautz et al. | 324/309 |
| 2015/0091571 A1 * | 4/2015 | Park et al. | 324/309 |

FOREIGN PATENT DOCUMENTS

| | | |
|---|---|---|
| EP | 2 116 859 A2 | 11/2009 |
| KR | 10-2005-0027947 A | 3/2005 |
| KR | 10-2005-0030575 A | 3/2005 |

OTHER PUBLICATIONS

Communication dated Feb. 11, 2013 from the European Patent Office in counterpart application No. 12191389.1.

Tang et al., "Interleaved water and fat imaging and applications to lipid quantitation using the gradient reversal technique", Journal of Magnetic and Resonance Imaging, vol. 26, No. 4, Jan. 1, 2007, pp. 1064-1070.

Volk et al., "Chemical shift-specific slice selection. A new method for chemical shift imaging at high magnetic field", Journal of Magnetic Resonance, Academic Press, London, GB, vol. 71, No. 1, Jan. 1, 1987, pp. 168-174.

Sarlls et al., "Robust fat suppression at 3T in high-resolution diffusion-weighted single-shot echo-planar imaging of human brain", Magnetic Resonance in Medicine, vol. 66, No. 6, May 20, 2011, pp. 1658-1665.

Takahara et al., "Fat suppression with Slice-Selection Gradient Reversal (SSGR) Revisited", Proc. Intl. Soc. Mag. Res. Med. 17, Jan. 1, 2009, pp. 2642.

Gomori et al., "Fat Suppression by Section-Select Gradient Reversal on Spin-Echo MR Imaging", Radiology, vol. 168, Aug. 1988, pp. 493-495.

Park et al., "Gradient Reversal Technique and Its Applications to Chemical-Shift-Related NMR Imaging", Magnetic Resonance in Medicine, vol. 4, Jan. 1, 1987, pp. 526-536.

Communication dated Dec. 1, 2015, issued by the State Intellectual Property Office of P.R. China in Chinese Application No. 201210443867.5.

* cited by examiner

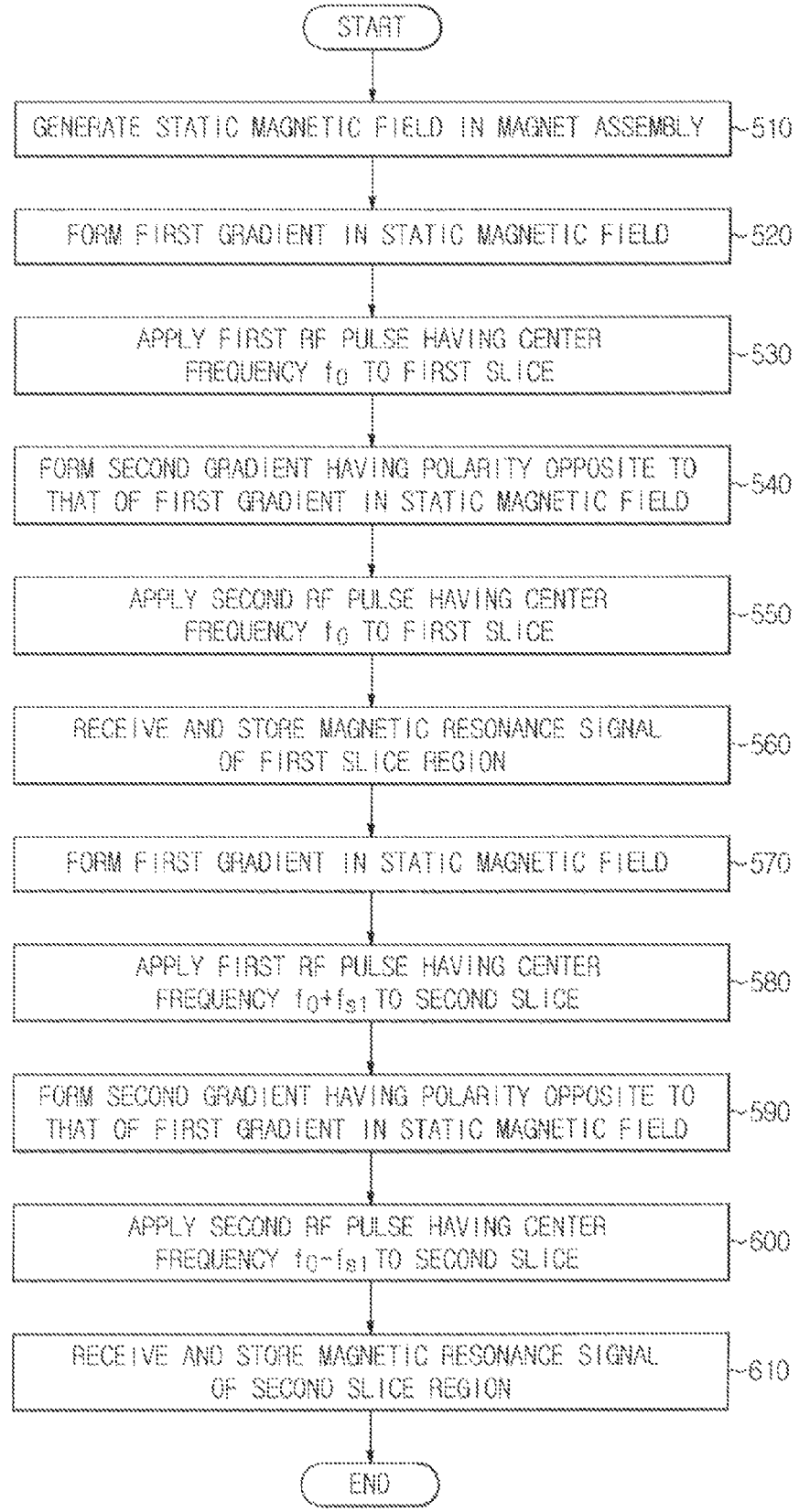

MAGNETIC RESONANCE IMAGING APPARATUS AND CONTROL METHOD THEREOF

CROSS-REFERENCE TO RELATED APPLICATION

This application claims priority from Korean Patent Application No. 10-2011-0116116, filed on Nov. 8, 2011 in the Korean Intellectual Property Office, the disclosure of which is incorporated herein by reference in its entirety.

BACKGROUND

1. Field

Apparatuses and methods according to exemplary embodiments relate to a magnetic resonance imaging (MRI) apparatuses and methods used to diagnose various diseases using a magnetic resonance image.

2. Description of the Related Art

Generally, a medical imaging device is a device that acquires information of a patient to provide an image. Examples of the medical imaging device include an ultrasonic diagnostic device, an X-ray tomography device, a magnetic resonance imaging device, and a medical diagnostic device. The magnetic resonance imaging device is an important tool in providing a diagnosis since image capturing conditions are relatively easy, contrast in soft tissue is excellent, and various diagnostic information images can be provided.

Magnetic resonance imaging (MRI) enables a nuclear magnetic resonance phenomenon to occur in hydrogen atomic nuclei in the human body by using a magnetic field harmless to the human body and a radio wave, which is non-ionizing radiation, to obtain density and physicochemical properties of the atomic nuclei.

Specifically, the magnetic resonance imaging device is an image diagnostic device that supplies a uniform frequency and energy to atomic nuclei in a state in which a uniform magnetic field is applied to the atomic nuclei and converts energy emitted from the atomic nuclei into a signal to diagnose the interior of the human body.

A proton of each atomic nucleus has spin angular momentum and a magnetic dipole. When a magnetic field is applied to atomic nuclei, therefore, the atomic nuclei are arranged in a direction of the magnetic field and perform precession about the direction of the magnetic field. Such precession enables images of the human body to be acquired through a nuclear magnetic resonance phenomenon.

However, each atom of fat and each atom of water have different precession speeds. For example, when magnetic resonance images are obtained with respect to multiple slices, a plurality of scanning operations may be required, or overlap between the respective magnetic resonance images may occur.

SUMMARY

Exemplary embodiments may address at least the above problems and/or disadvantages and other disadvantages not described above. Also, the exemplary embodiments are not required to overcome the disadvantages described above, and an exemplary embodiment may not overcome any of the problems described above.

According to one or more of exemplary embodiments, a magnetic resonance imaging apparatus obtains magnetic resonance images, from which errors due to off-resonance components are corrected, with respect to multiple slices which prevents overlap between the respective magnetic resonance images and a control method thereof.

In accordance with an aspect of an exemplary embodiment, a magnetic resonance imaging apparatus includes a main magnet which generates a static magnetic field in an imaging region; gradient coils which form magnetic field gradients in the static magnetic field; a radio frequency (RF) coil assembly which applies a first RF pulse and a second RF pulse to n (n≥2) slice regions located at different positions in the imaging region to excite atomic nuclei of the slice regions; and a controller which controls the RF coil assembly to apply the first RF pulse and the second RF pulse having a first center frequency $f_0$ to a first slice, to apply a first RF pulse having a second center frequency $f_0+f_{s1}$ to a second slice, and to apply a second RF pulse having a third center frequency $f_0-f_{s1}$ to the second slice.

The controller may control the gradient assembly to form a first gradient in the static magnetic field upon applying the first RF pulse and to form a second gradient having a polarity opposite to that of the first gradient in the static magnetic field upon applying the second RF pulse.

The controller may control the RF coil assembly so that the center frequency of each of the RF pulses applied to each of the slices is shifted by a predetermined quantity $f_s$.

The controller may control the RF coil assembly to adjust the center frequency of each of the RF pulses to decide order of the slices.

The controller may control the RF coil assembly so that the RF pulses have the same bandwidth with respect to the respective slices.

The controller may control the RF coil assembly so that $f_s$ is equal to or greater than the bandwidth.

If $f_s$ is greater by $f_{gap}$ than the bandwidth, the controller may control the RF coil assembly to adjust $f_{gap}$ to obtain a desired slice gap.

In accordance with another aspect of an exemplary embodiment, there is provided a control method of a magnetic resonance imaging apparatus to acquire a magnetic resonance signal with respect to n (n≥2) slice regions located at different positions in an imaging region, the control method including: generating a static magnetic field in the imaging region; forming magnetic field gradients in the static magnetic field; applying a first RF pulse having a first center frequency $f_0$ to a first slice; applying a second RF pulse having the first center frequency $f_0$ to the first slice; applying a first RF pulse having a second center frequency $f_0+f_{s1}$ to a second slice; and applying a second RF pulse having a third center frequency $f_0-f_{s1}$ to the second slice.

The forming the gradient in the static magnetic field may include forming a first gradient in the static magnetic field upon applying the first RF pulse and forming a second gradient having a polarity opposite to that of the first gradient in the static magnetic field upon applying the second RF pulse.

The center frequency of each of the RF pulses applied to each of the slices may be shifted by a predetermined quantity $f_s$.

The center frequency of each of the RF pulses may be adjusted to decide order of the slices.

The RF pulses may have the same bandwidth with respect to the respective slices.

$f_s$ may be equal to or greater than the bandwidth.

If $f_s$ is greater by $f_{gap}$ than the bandwidth, $f_{gap}$ may be adjusted to obtain a desired slice gap.

BRIEF DESCRIPTION OF THE DRAWINGS

The above and/or other aspects will become more apparent by describing certain exemplary embodiments, with reference to the accompanying drawings, in which:

FIG. 12 is a flowchart illustrating a process of generating magnetic field gradients according to an exemplary embodiment.

DETAILED DESCRIPTION

Figure 1:
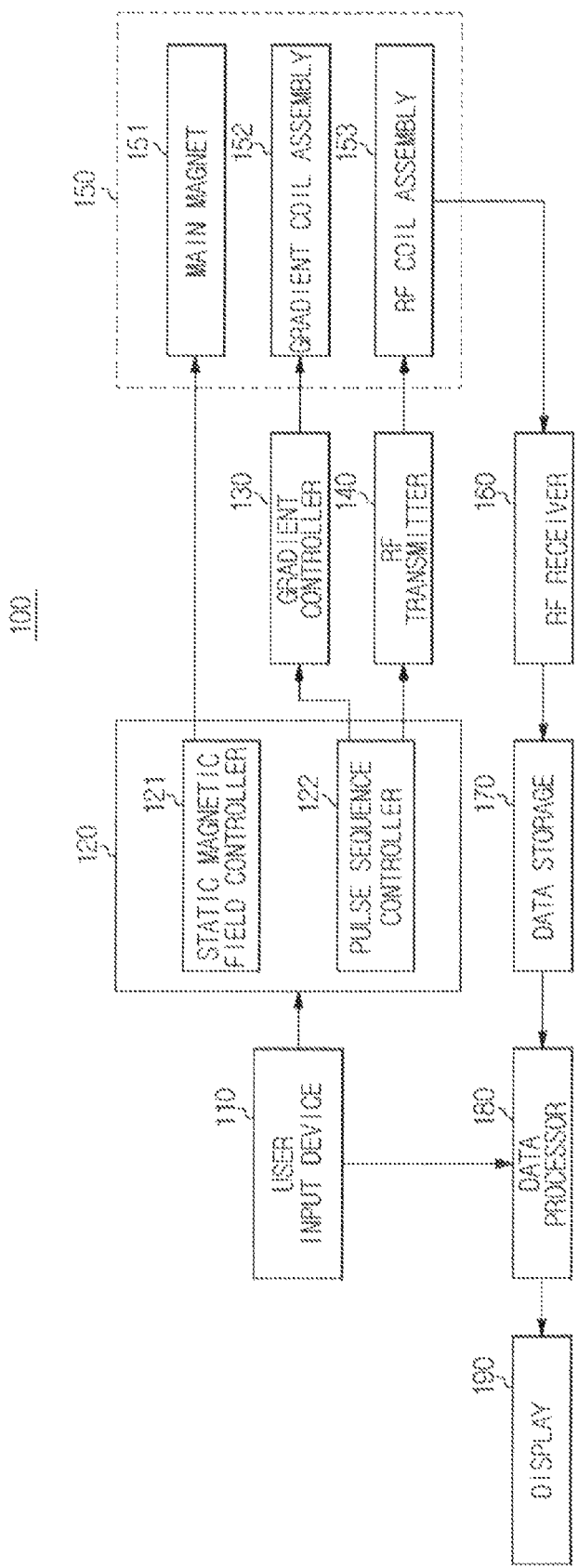
FIG. 1 is a control block diagram of a magnetic resonance imaging (MRI) apparatus according to an exemplary embodiment.

Certain exemplary embodiments are described in greater detail below with reference the accompanying drawings.

In the following description, the same drawing reference numerals are used for the same elements even in different drawings. The matters defined in the description, such as detailed construction and elements, are provided to assist in a comprehensive understanding of exemplary embodiments. Thus, it is apparent that exemplary embodiments can be carried out without those specifically defined matters. Also, well-known functions or constructions are not described in detail since they would obscure exemplary embodiments with unnecessary detail.

FIG. 1 is a control block diagram of a magnetic resonance imaging apparatus according to an exemplary embodiment.

Referring to FIG. 1, the magnetic resonance imaging apparatus 100 according to an exemplary embodiment includes a magnet assembly 150 to form a magnetic field and to generate a resonance phenomenon with respect to atomic nuclei, a controller 120 to control the operation of the magnet assembly 150, an RF receiver 160, i.e., a data collection unit, to receive data regarding a magnetic resonance signal generated from the atomic nuclei, and a data processor 180 to process the data received by the RF receiver 160 to generate a magnetic resonance image.

The magnet assembly 150 includes a main magnet 151, i.e., a static magnetic field coil unit, to generate a static magnetic field, i.e., a $B_0$ magnetic field, in the magnet assembly 150, a gradient coil assembly 152, i.e., gradient coils, to form a gradient in the static magnetic field, and a radio frequency (RF) coil assembly 153 to excite the atomic nuclei and to receive a magnetic resonance signal from the atomic nuclei.

The controller 120 includes a static magnetic field controller 121 to control intensity and direction of the static magnetic field generated by the main magnet 151 and a pulse sequence controller 122 to control the gradient coil assembly 152 and the RF coil assembly 153 according to a pulse sequence.

The magnetic resonance imaging apparatus 100 according to an exemplary embodiment also includes a gradient controller 130 to apply a gradient signal to the gradient coil assembly 152 and an RF transmitter 140 to apply an RF signal to the RF coil assembly 153. The pulse sequence controller 122 may control the gradient controller 130 and the RF transmitter 140 to adjust a magnetic field gradient formed in the static magnetic field and RF pulses applied to the atomic nuclei.

For example, the magnetic resonance imaging apparatus 100 according to an exemplary embodiment includes a user input device 110, i.e., a user manipulation unit, to allow a user to input a control command regarding the operation of the magnetic resonance imaging apparatus 100. In particular, a pulse sequence may be generated based on a command regarding a scan sequence input by the user.

For example, the magnetic resonance imaging apparatus 100 according to an exemplary embodiment includes a display 190 to display a magnetic resonance image generated by the data processor 180 so that the user may diagnose a health state of an imaged person.

Figure 2:
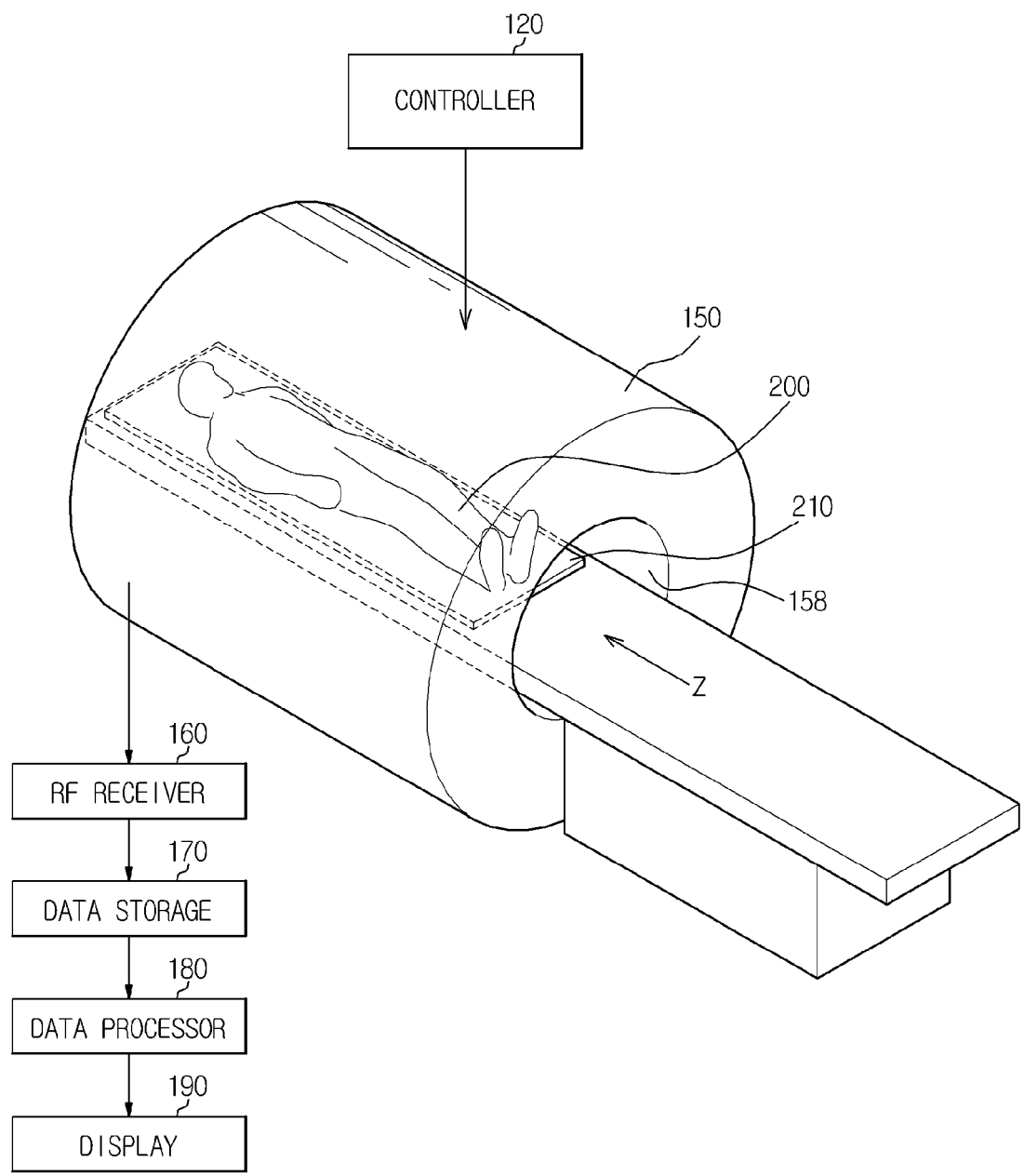
FIG. 2 is an overall view of the MRI apparatus according to an exemplary embodiment.
Figure 3:
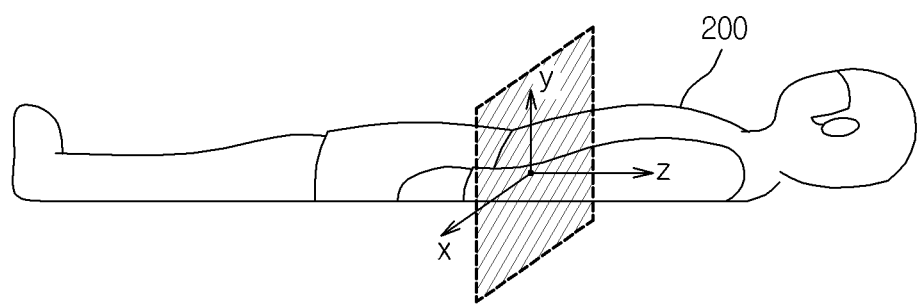
FIG. 3 is a view showing a space divided into x, y, and z axes, in which a person to be tested lies.

FIG. 2 is an overall view of the magnetic resonance imaging apparatus 100 according to an exemplary embodiment, and FIG. 3 is a view showing a cross-section of an examination region, i.e., imaging region, divided into x, y, and z axes, in which a person 200 to be tested lies.

The operation of the magnetic resonance imaging apparatus 100 according to an exemplary embodiment is described in detail below with reference to FIGS. 1, 2, and 3.

The magnet assembly 150 is formed as a cylinder having a hollow inner space, such as a cavity or a bore 158, which corresponds to an examination region. A person to be tested is placed on a transfer unit 210 and brought into the bore 158 to obtain a magnetic resonance signal.

As described above, the magnet assembly 150 includes the main magnet 151, the gradient coil assembly 152, and the RF coil assembly 153. The main magnet 151 may be a coil wound around the bore 158. When current is applied to the main magnet 151, a uniform static magnetic field $B_0$ is generated in the bore 158, i.e., the examination region. Generally, the direction of the static magnetic field is parallel to an axis z of the magnet assembly 150.

When the static magnetic field is generated in the bore, atomic nuclei of atoms, such as the hydrogen atoms of the person 200, are arranged in the direction of the static magnetic field and perform precession about the direction of the static magnetic field. Precession speed of the atomic nuclei is determined by a precession frequency, i.e., a Larmor frequency, which is represented by the following equation 1.

$$\omega = \gamma B_0, \qquad \text{[Equation 1]}$$

where $\omega$ is a precession frequency, $\gamma$ is a proportional constant, i.e., a gyromagnetic ratio, and $B_0$ is a strength or intensity of a $B_0$ magnetic field, which is measured in tesla (T) or gauss (G).

The proportional constant $\gamma$ is different for each kind of atomic nuclei.

For example, a hydrogen proton has a precession frequency of 42.58 MHz in a magnetic field of 1 T. Since hydrogen constitutes majority of the atoms of the human body, the magnetic resonance imaging apparatus 100 mainly obtains a magnetic resonance signal using precession of hydrogen protons.

The gradient coil assembly 152 forms a gradient in the static magnetic field generated in the bore 158 to generate a magnetic field gradient.

As shown in FIG. 3, a z axis is parallel to the longitudinal direction of the person 200 and to the direction of the static magnetic field, an x axis is parallel to the lateral direction of the person 200, and a y axis is parallel to the vertical direction of a diameter of the bore 158.

Magnetic field gradients in the x, y, and z axes may be generated to obtain three-dimensional (3D) space information, and therefore, the gradient coil assembly 152 includes three gradient coils. The z-axis gradient coil forms a gradient in the z-axis direction. As higher current is applied to the z-axis gradient coil, a magnetic field gradient having greater gradient is generated, by which a thinner slice may be selected. The z-axis gradient coil is used to select a slice.

The spatial position along the x axis of the person 200 is known by a magnetic field gradient generated by the x-axis gradient coil. Consequently, the magnetic field gradient generated by the x-axis gradient coil is used in frequency encoding. A magnetic field gradient generated by the y-axis gradient coil is mainly used in phase encoding.

The gradient coil assembly 152 is connected to the gradient controller 130. The gradient controller 130 applies a drive signal to the gradient coil assembly 152 according to a control signal received from the pulse sequence controller 122 to generate magnetic field gradients. The gradient controller 130 may include three driving circuits corresponding to the three gradient coils of the gradient coil assembly 152.

Generation of magnetic field gradients is described in greater detail below.

As described above, atomic nuclei arranged by a static magnetic field perform precession at a Larmor frequency. The magnetization vector sum of several atomic nuclei may be represented by single net magnetization M.

A z-axis component of the net magnetization is not measured, and, thus, only $M_{xy}$ may be detected. Consequently, the net magnetization may be present on an XY plane to obtain a magnetic resonance signal, which corresponds to the excitation of atomic nuclei. To excite atomic nuclei, RF tuned to a Larmor frequency of atomic nuclei may be applied to a static magnetic field.

The RF coil assembly 153 generates a high-frequency magnetic field in a static magnetic field space to excite atomic nuclei in the person 200 by transmitting an RF pulse, i.e., an RF excitation signal.

The RF coil assembly 153 includes a transmit coil to transmit an RF excitation signal and a receive coil to receive an electromagnetic wave emitted from the excited atomic nuclei, i.e., a magnetic resonance signal.

The RF coil assembly 153 is connected to the RF transmitter 140 which transmits an RF excitation signal to the RF coil assembly 153 according to a control signal received from the pulse sequence controller 122.

The RF transmitter 140 may include a modulation circuit to modulate a high-frequency output signal into an RF pulse signal and an RF power amplifier to amplify the RF pulse signal.

The RF coil assembly 153 is connected to the RF receiver 160. The RF receiver 160 includes a preamplifier to amplify the magnetic resonance signal received by the receive coil of the RF coil assembly 153, a phase detector to detect a phase of the magnetic resonance signal received from the preamplifier, and an A/D converter to convert an analog signal acquired by the phase detector into a digital signal. The RF receiver 160 transmits the digitally converted magnetic resonance signal to a data storage 170.

The data storage 170 has a data space constituting a two-dimensional (2D) Fourier space. Upon completing storage of all of the scanned data, the data processor 180 performs 2D inverse Fourier transform and/or other appropriate processes, with respect to the stored data, to reconstruct an image. The reconstructed image is displayed on the display 190.

A spin echo pulse sequence is used to obtain a magnetic resonance signal from atomic nuclei. When the RF coil assembly 153 applies an RF pulse and then applies another RF pulse after an appropriate time Δt lapses, transverse magnetization appears in the atomic nuclei after the lapse of the time Δt, and a magnetic resonance signal may be obtained. This method is referred to as a spin echo pulse sequence. Time taken until a magnetic resonance signal is generated after application of a first RF pulse is referred to as time echo (TE).

To what extent a proton has been flipped may be indicated by an angle moved from an axis at which the proton had been located before flip. A 90° RF pulse or a 180° RF pulse appears depending upon a flip degree.

In an exemplary embodiment which is described below, the spin echo pulse sequence is used. For example, a first RF pulse corresponds to a 90° RF pulse, and a second RF pulse corresponds to a 180° RF pulse.

Figure 4:
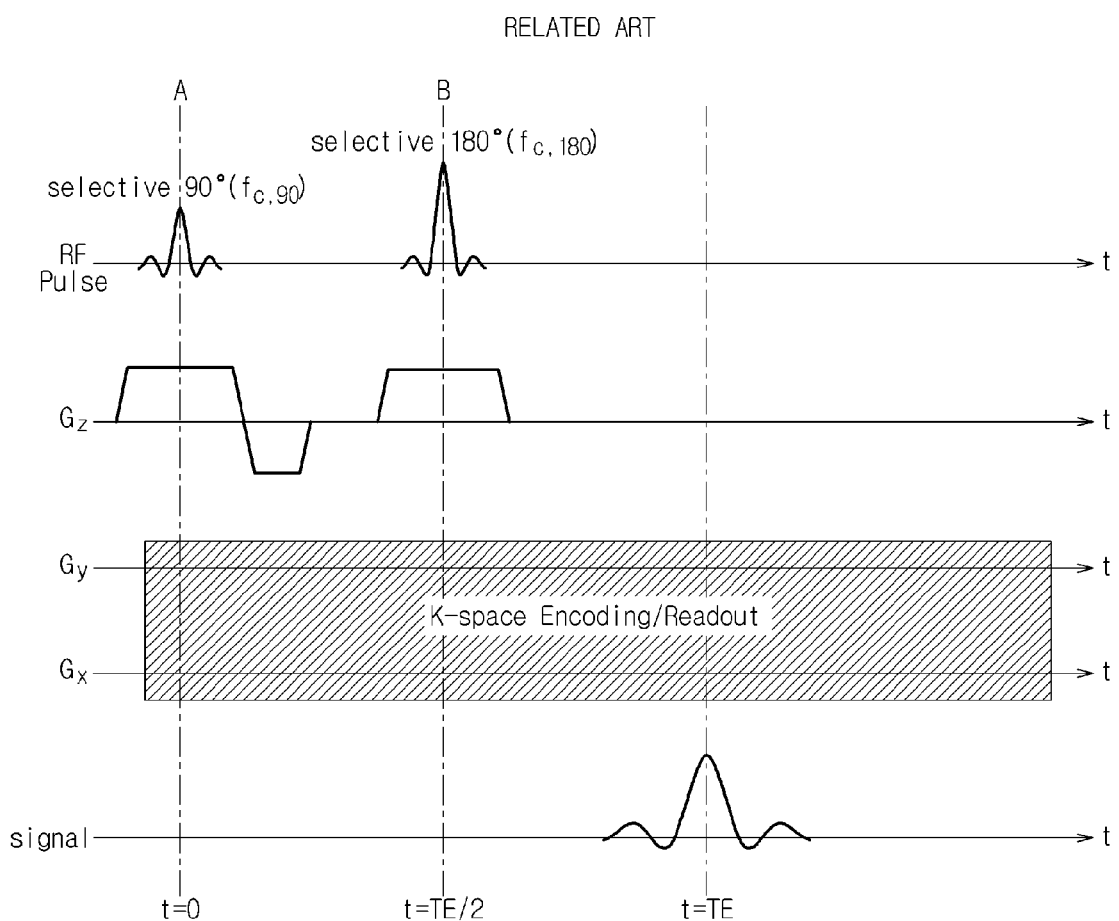
FIG. 4 is a pulse sequence diagram in a case in which a spin echo pulse sequence is used.
Figure 5:
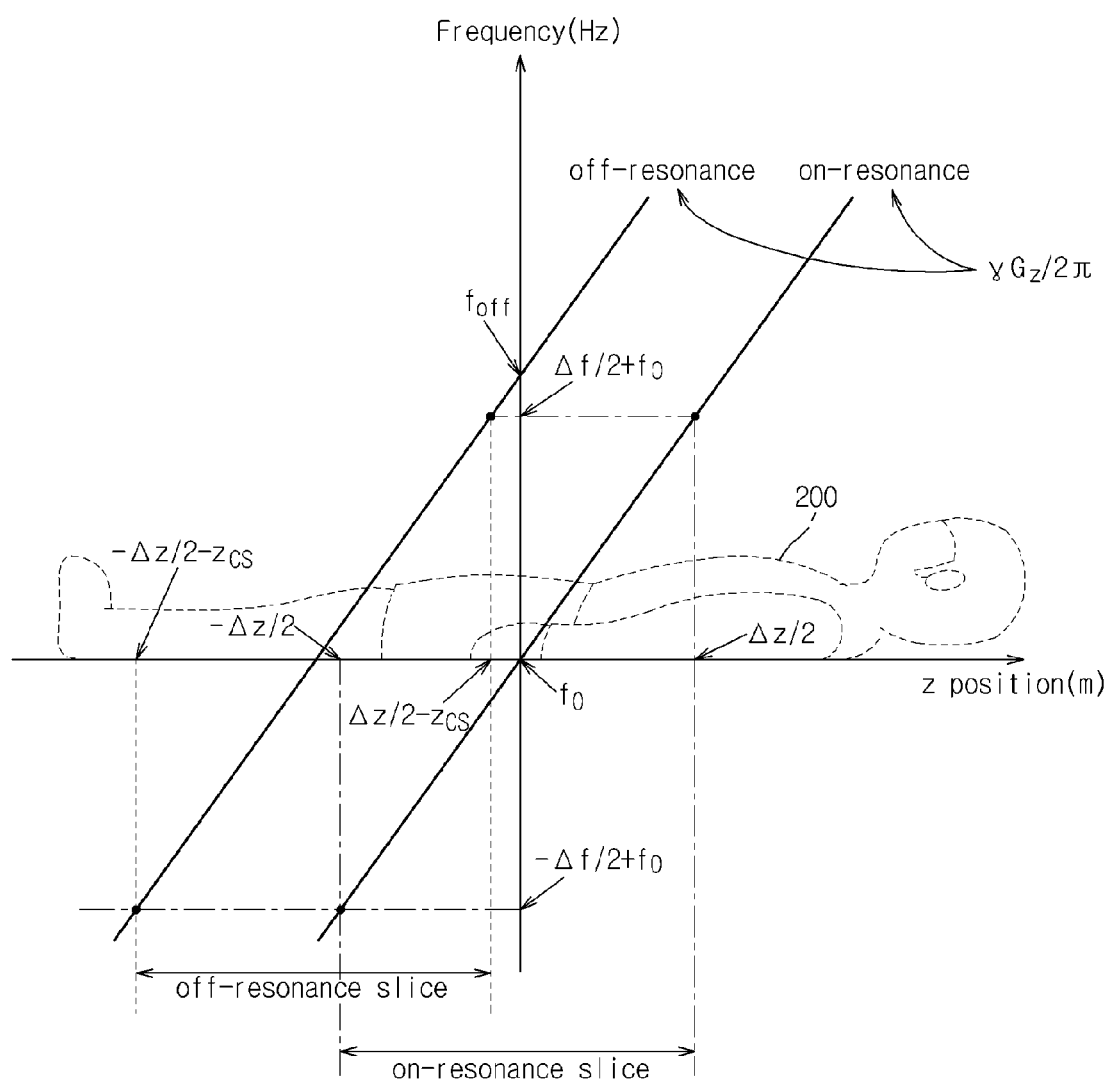
FIG. 5 is a graph illustrating a magnetic resonance signal and slice regions obtainable when a pulse according to FIG. 4 is generated.

FIG. 4 is a pulse sequence diagram in a case in which the spin echo pulse sequence is used, and FIG. 5 is a graph illustrating a magnetic resonance signal and slice regions obtainable when a pulse according to FIG. 4 is generated.

Referring to FIG. 4, when a first RF pulse and a second RF pulse are transmitted, a magnetic field is changed in a z-axis direction to select a specific region, which is referred to as a slice selection gradient. A phase encoding gradient changes a magnetic field in a y-axis direction to divide a selected slice along the y axis. Spins of atomic nuclei have different phases depending upon position. A frequency encoding gradient or a readout gradient changes a magnetic field in an x-axis direction to divide pieces divided by the phase encoding gradient. Each piece is referred to as a pixel. The pixels have different frequencies, and therefore, distinction between pixels may be possible.

Consequently, a k-space is filled with signals acquired by the y-axis gradient and the x-axis gradient.

When a z-axis gradient formed by applying the second RF pulse has the same polarity as a gradient formed by applying the first RF pulse, as shown in FIG. 4, a graph as shown in FIG. 5 is obtained.

Referring to FIG. 5, a horizontal axis is a z axis. A person 200 is placed along the z axis, and a z-axis position indicates a slice position. A vertical axis indicates a frequency of an RF pulse, and a straight line having a gradient indicates a gradient applied to the z axis.

Although hydrogen atoms are present in a magnetic field having the same intensity, precession frequencies differ depending upon whether the hydrogen atoms are in a fat layer or in a muscle. Generally, the precession frequency of hydrogen atoms of a fat layer is lower than that of hydrogen atoms of other organs. When an RF pulse is applied, a magnetic resonance signal is generated in another region in addition to a slice selected by a user, based on an off-resonance component, as shown in FIG. 5.

Specifically, when the intensity of a static magnetic field is B, a Larmor frequency may be represented by $f=\gamma B/2\pi$. Variation of a resonance frequency has a relationship of $\Delta f=\gamma \Delta B/2\pi$ with respect to change in a magnetic field. When the size of a slice selection gradient is $G_z$, a relationship between the thickness Δz of the slice and the bandwidth of the frequency is $\Delta f=\gamma G_z \Delta z/2\pi$ which provides $\Delta z=2\pi\Delta f/(\gamma G_z)$.

That is, when an RF pulse having a bandwidth of Δf and a uniform gradient $G_z$ are applied, as shown in FIG. 5, a magnetic resonance signal is generated at a slice position corresponding to a region from $-\Delta z/2$ to $\Delta z/2$ of an on-resonance component having the same resonance frequency at a 90° RF pulse and a 180° RF pulse. A magnetic resonance signal is also generated at a slice position corresponding to a region from $-\Delta z/2-z_{cs}$ to $\Delta z/2-z_{cs}$ of an off-resonance component having an offset frequency $f_{off}$. The slice position corresponding to a region from $-\Delta z/2-z_{cs}$ to $\Delta z/2-z_{cs}$ is not a region selected by a user.

In the magnetic resonance imaging apparatus 100 according to an exemplary embodiment, a slice selection gradient formed when a second RF pulse is applied to obtain a magnetic resonance signal with respect to only the slice selected by the user in consideration of the off-resonance component, i.e., the gradient applied to the z axis has a polarity opposite to that of a gradient when a first RF pulse is applied, as described in greater detail below.

Figure 6:
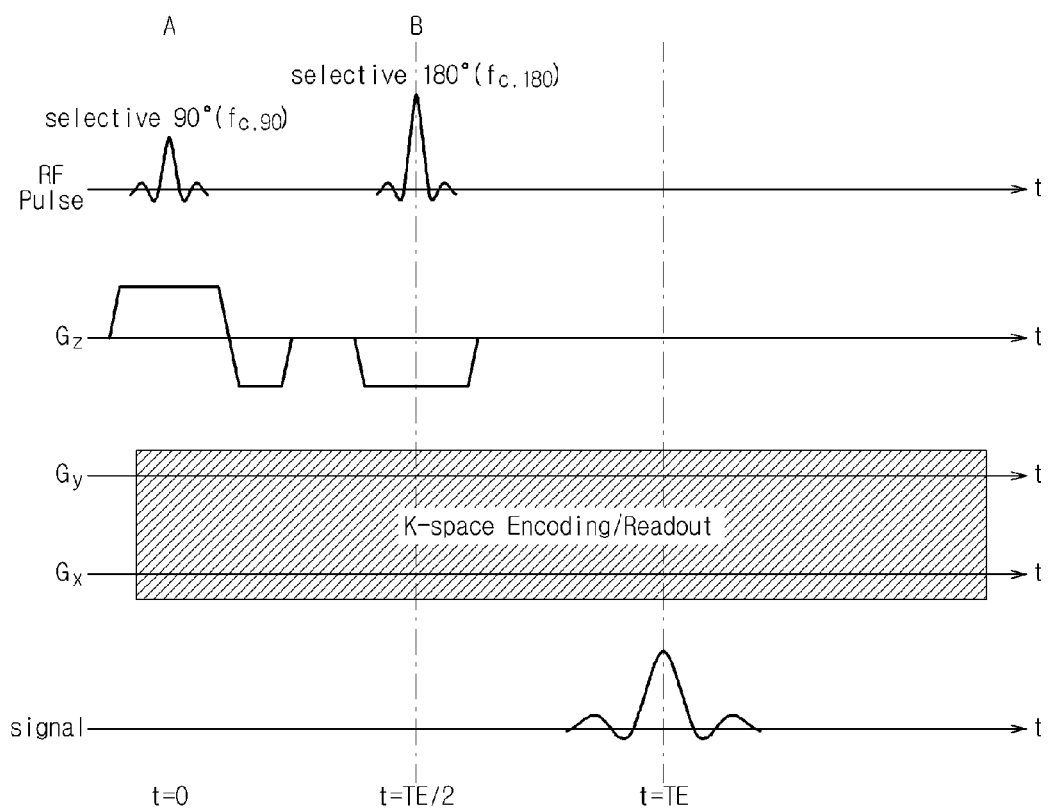
FIG. 6 is a pulse sequence diagram used in the magnetic resonance imaging apparatus according to an exemplary embodiment.
Figure 7:
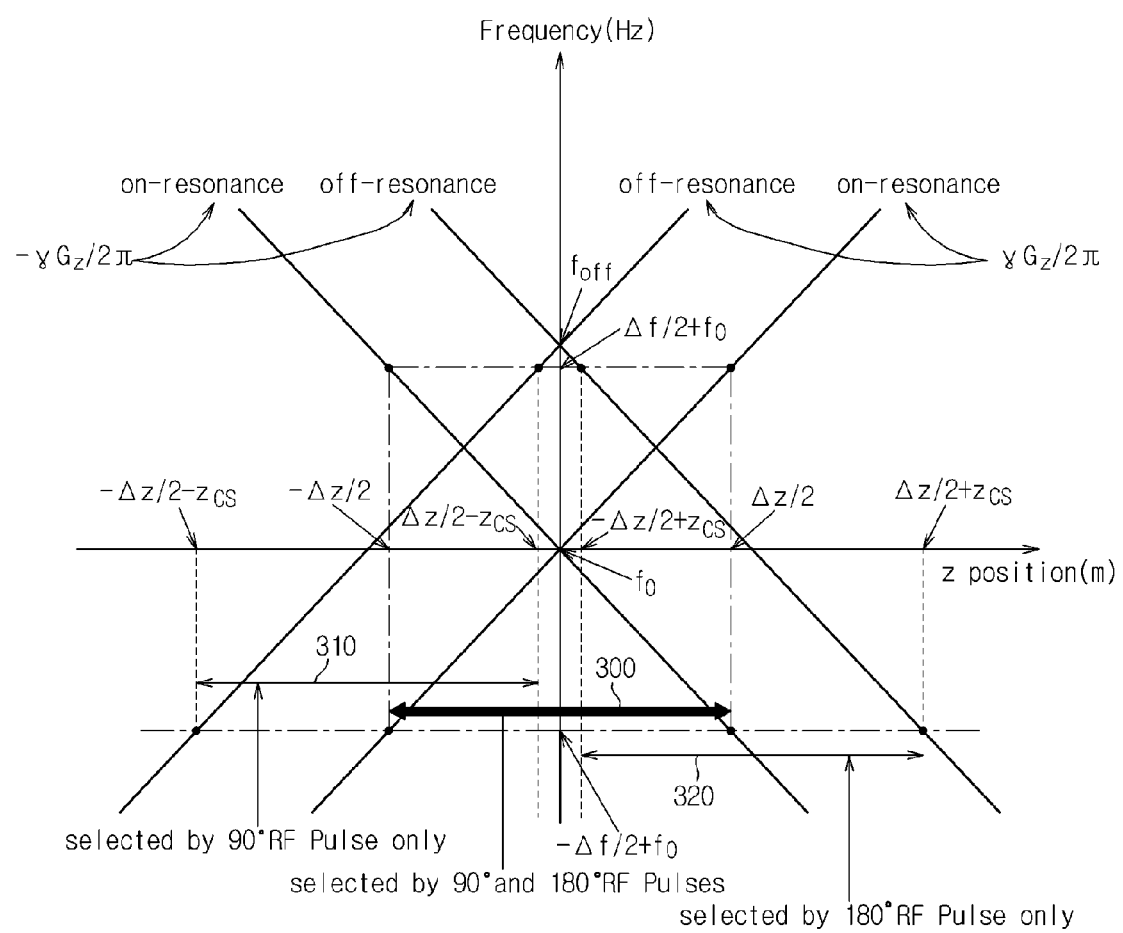
FIG. 7 is a graph illustrating a magnetic resonance signal and slice regions obtainable when a pulse is generated according to an exemplary embodiment.

FIG. 6 is a pulse sequence diagram used in the magnetic resonance imaging apparatus 100 according to an exemplary embodiment, and FIG. 7 is a graph illustrating a magnetic resonance signal and slice regions obtainable when a pulse according to FIG. 6 is generated.

Referring to FIG. 6, in the magnetic resonance imaging apparatus 100 according to an exemplary embodiment, a second slice selection gradient formed when a second RF pulse is applied has a polarity opposite to that of a first slice selection gradient formed when a first RF pulse is applied. In this case, slice selection positions as shown in FIG. 7 are selected.

Referring to FIG. 7, a slice region 300, which is selected by an on-resonance component when a first RF pulse is applied, corresponds to a region from $-\Delta z/2$ to $\Delta z/2$, and a slice region 310, which is selected by an off-resonance component, corresponds to a region from $-\Delta z/2-z_{cs}$ to $\Delta z/2-z_{cs}$. When a second RF pulse is applied, a same slice region 300 is selected by an on-resonance component, from $-\Delta z/2$ to $\Delta z/2$, and a slice region 320, which is selected by an off-resonance component, corresponds to a region from $-\Delta z/2+z_{cs}$ to $\Delta z/2+z_{cs}$.

Consequently, the slice region 300, which is selected when both the first RF pulse and the second RF pulse are applied, corresponds to a region from $-\Delta z/2$ to $\Delta z/2$. If a relation $\Delta f/2 < f_{off}$ is satisfied, different slice regions 310 and 320 of the off-resonance component are selected when the first RF pulse and the second RF pulse are applied, as shown in FIG. 7. Consequently, a region to finally generate a magnetic resonance signal includes only the on-resonance component, and the off-resonance component does not affect the generated signal. As a result, the user may generate a magnetic resonance signal with respect to only the initially selected region.

To achieve higher accuracy of the diagnosis using the magnetic resonance imaging apparatus, the same region may be divided into several slices so that several slice images are acquired and analyzed.

In the magnetic resonance imaging apparatus 100 according to an exemplary embodiment, a center frequency of a first RF pulse and a center frequency of a second RF pulse of a second or subsequent slice have polarities opposite to those of center frequencies of a first slice to obtain slice images of different regions without additional scanning, as described below in greater detail with reference to FIGS. 8 and 9.

Figure 8:
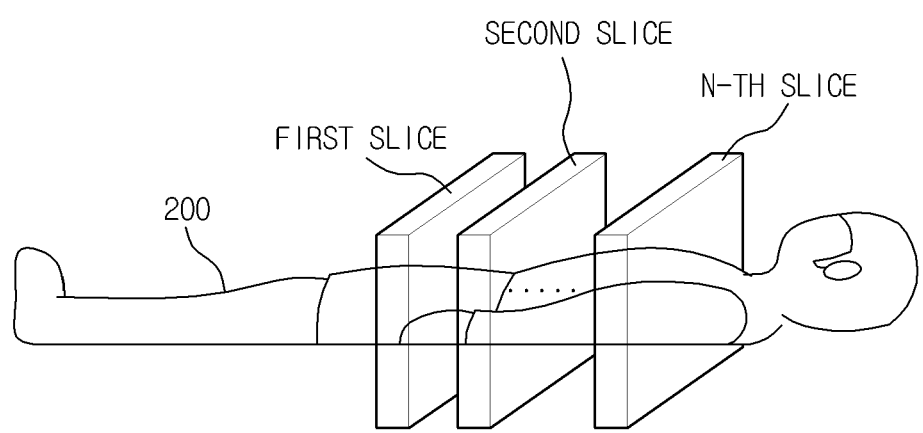
FIG. 8 is a view schematically showing a plurality of slices with respect to a person to be tested.
Figure 9:
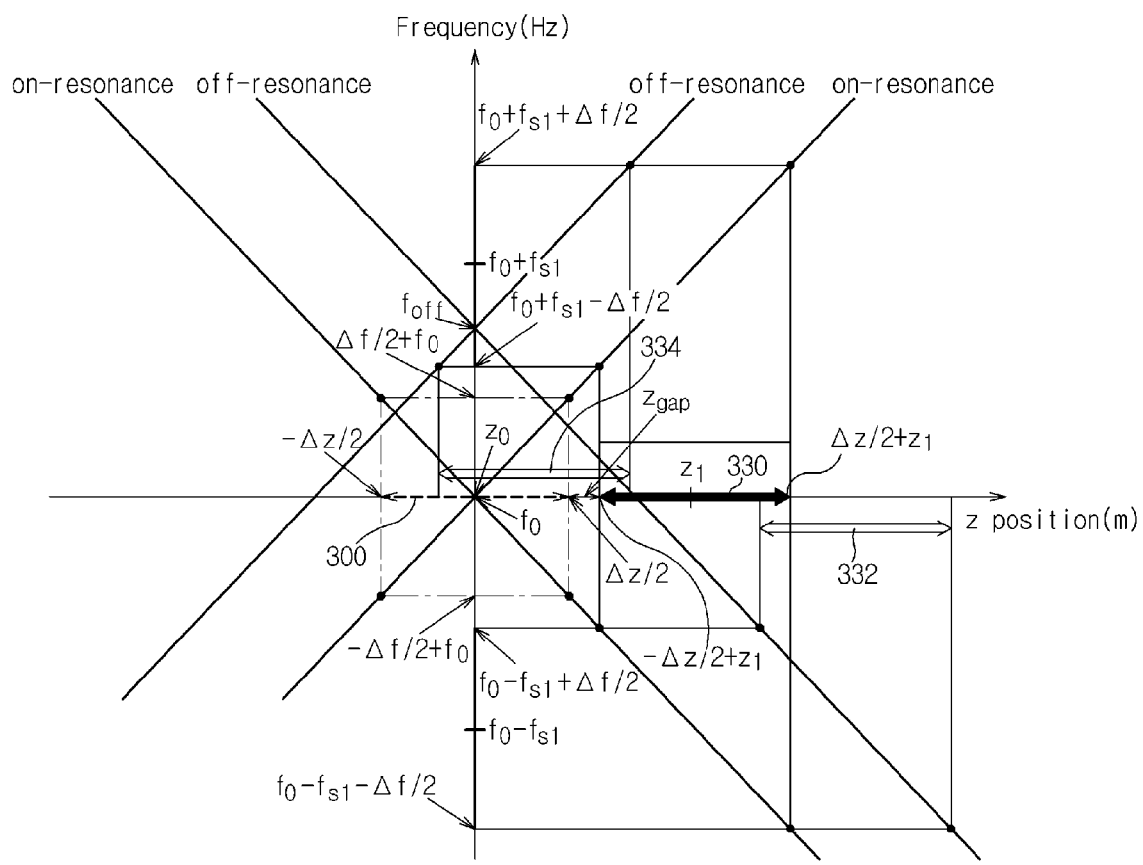
FIG. 9 is a graph showing slice regions which are selected according to an exemplary embodiment.

FIG. 8 is a view schematically showing a plurality of slices with respect to the person to be tested, and FIG. 9 is a graph showing slice regions selected by the magnetic resonance imaging apparatus 100 according to an exemplary embodiment.

Referring to FIG. 8, selected slices with respect to the person 200 may include a first slice, and a second slice through an n-th slice in the z-axis direction. In FIG. 8, each slice is exaggerated for the convenience of description. However, the actual thickness of each slice may be different from what is illustrated in FIG. 8.

Referring to FIG. 9, a first center frequency of an RF pulse of a first slice is $f_0$, a first gradient and a second gradient have opposite polarities, and a first slice region 300 is from $-\Delta z/2$ to $\Delta z/2$, as described above with reference to FIG. 7.

As illustrated in FIG. 9, a position $z_0$ selected by a first center frequency of an RF pulse is set to 0. However, the z axis merely indicates the positions of slices, and $z_0$ may be set to at a different position.

When a second center frequency of a first RF pulse to obtain a magnetic resonance signal of the second slice is set to $f_0+f_{s1}$, a second slice region 330 selected by an on-resonance component is from $-\Delta z/2+z_1$ to $\Delta z/2+z_1$. A slice region 332 selected by an off-resonance component is a region at the right side of the second slice region 330. Here, $f_{s1}$ indicates a quantity shifted from $f_0$.

When a third center frequency of a second RF pulse to obtain a magnetic resonance signal of the second slice is set to $f_0-f_{s1}$, a slice region selected by an on-resonance component is the second slice region 330 from $-\Delta z/2+z_1$ to $\Delta z/2+z_1$, and a slice region 334 selected by an off-resonance component is a region at the left side of the second slice region 330.

Consequently, the second slice region 330 selected by both the first RF pulse and the second RF pulse when the RF pulses are applied to the second slice is from $-\Delta z/2+z_1$ to $\Delta z/2+z_1$, and an interference by the off-resonance can be avoided. Further, if a relation $f_0+\Delta f/2 \leq f_0+f_{s1}-\Delta f/2$, i.e., $f_{s1} \geq \Delta f$ is satisfied, a magnetic resonance signal may be obtained with respect to the second slice region which does not overlap the first slice region.

Further, $f_{s1}$ may be set as $f_{s1}=\Delta f+f_{gap}$, and a slice gap of $z_{gap}=2\pi f_{gap}/(\gamma G_z)$ may be secured, thereby preventing an overlap of slice regions.

Figure 10:
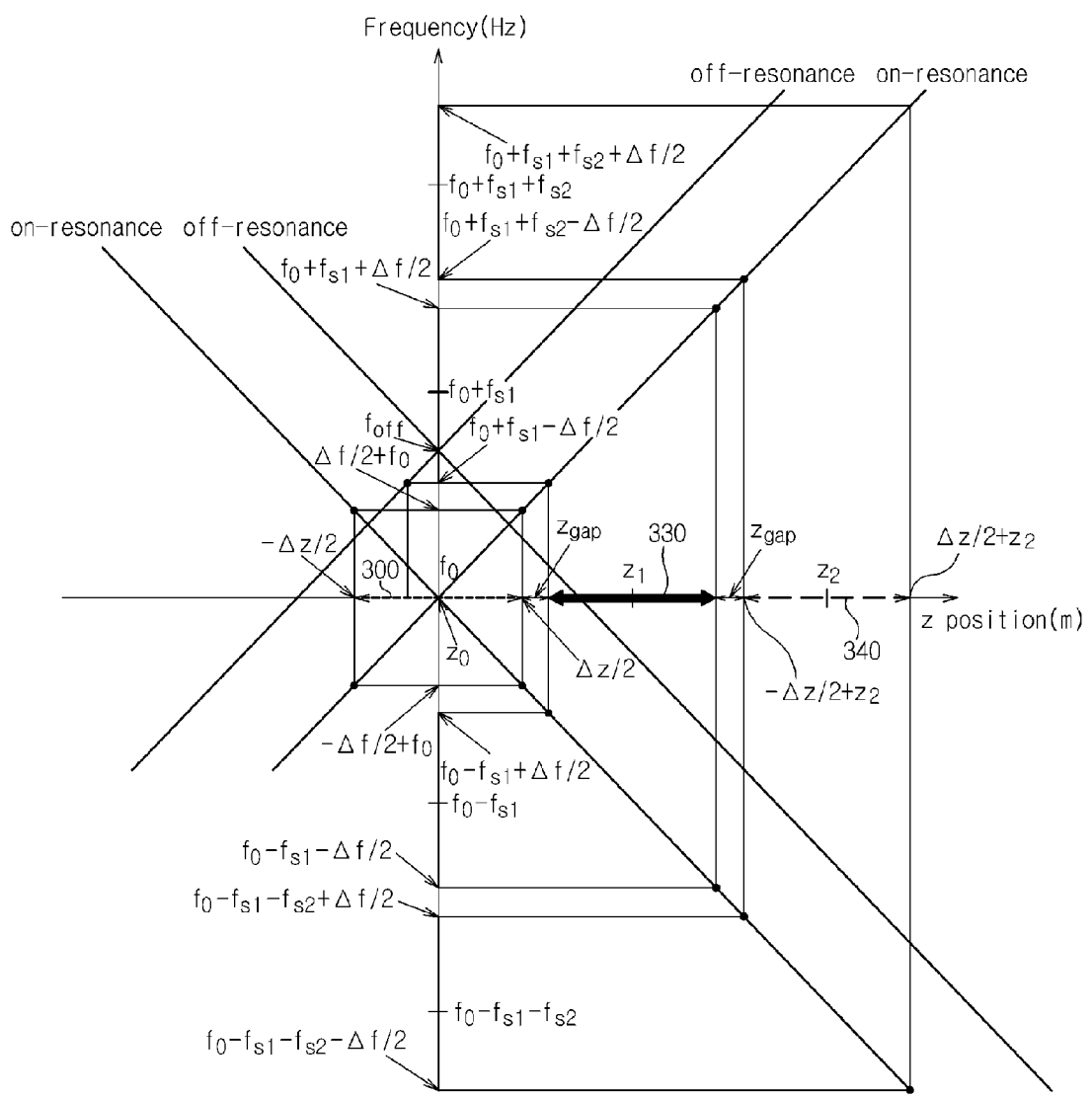
FIG. 10 is another graph showing first to third slice regions which are selected according to an exemplary embodiment.

FIG. 10 is a graph showing first to third slice regions selected by the magnetic resonance imaging apparatus 100 according to an exemplary embodiment.

The first slice and the second slice coincide with the first and second slice regions 300 and 330, shown in FIG. 9, and therefore, a description thereof is omitted.

When a center frequency of a first RF pulse is set to $f_0+f_{s1}+f_{s2}$, and a center frequency of a second RF pulse is set to $f_0-f_{s1}-f_{s2}$ to obtain a magnetic resonance signal of the third slice, only on-resonance components are excited when the first RF pulse and the second RF pulse are applied, as shown in FIG. 10, and therefore, a magnetic resonance signal is generated from a third slice region 340 from $-\Delta z/2+z_2$ to $\Delta z/2+z_2$, which is not affected by off-resonance components. For example, if a relation $f_0+f_{s1}+f_{s2}-\Delta f/2 \geq f_0+f_{s1}+\Delta f/2$, i.e., $f_{s2} \geq \Delta f$ is satisfied, the third slice region 340 does not overlap the second slice region 330, and $f_{s2}$ may be adjusted to obtain a desired slice gap. For example, $f_{s2}$ indicates a quantity shifted from $f_0+f_{s1}$ or $f_0-f_{s1}$.

For example, intervals or difference values between the center frequencies of the respective slices may be set to have a constant value $f_s$, i.e., so that $f_{s1}=f_{s2}=f_s$.

Accordingly, a center frequency of a second RF pulse of a second or subsequent slice may have a polarity opposite to that of a center frequency of a first RF pulse, and the respective center frequencies may be appropriately selected, thereby obtaining a plurality of slices which are not affected by off-resonance components and do not overlap one another through single scanning.

Particularly, when a magnetic resonance signal is obtained with respect to n slices, center frequencies of the RF pulses may be set to $f_k=f_0\pm kf_s$, (k=0, 1, 2, ..., n−1), to be shifted by a predetermined quantity $f_s$ to obtain a plurality of slice images which do not overlap one another, and $f_{gap}=f_s-\Delta f$ may be adjusted to adjust the size of the slice gap between selected slices.

Here, + symbol is used for the first RF signal, and − symbol is used for the second RF signal of the second or subsequent slice.

For example, the user may adjust the center frequencies of the RF pulses to freely change the order of the slices. That is, the first slice and the second slice through the n-th slice may be labeled or numbered in an order in which a magnetic resonance signal is acquired. As shown in FIG. 8, a second slice obtained next to the first slice may be a slice which is not adjacent to the first slice.

In the above-described exemplary embodiment, the spins of the hydrogen atoms of the fat layer are set as the off-resonance components. Alternatively, the spins of the hydrogen atoms of the fat layer are set as the on-resonance components. For example, when a region to be detected is set as an on-resonance component, only a magnetic resonance signal with respect to the selected slice region may be detected.

A control method of a magnetic resonance imaging apparatus according to an exemplary embodiment is described in detail below.

Figure 11:
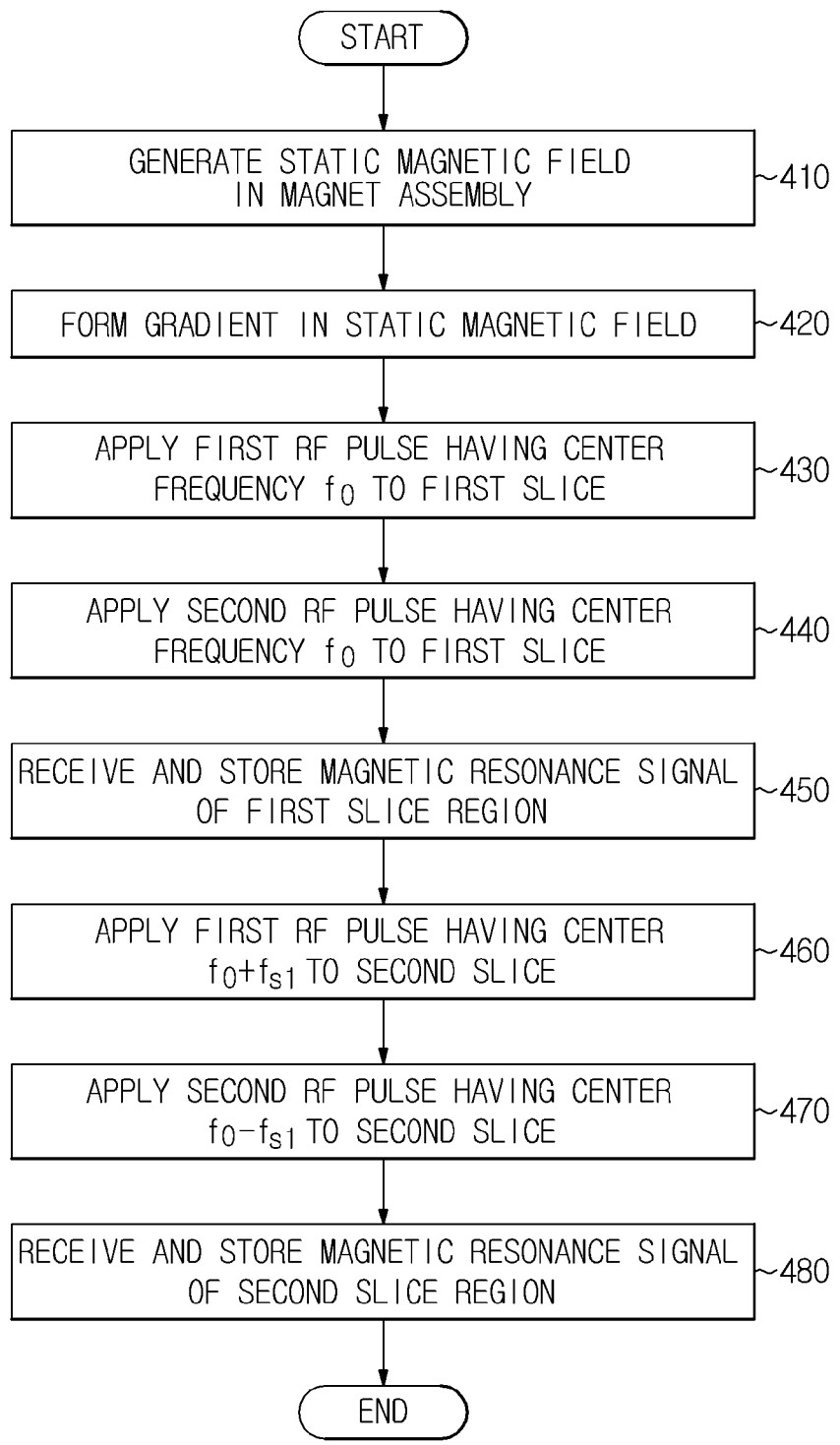
FIG. 11 is a flowchart showing a control method of an MRI apparatus according to an exemplary embodiment.

FIG. 11 is a flowchart of a control method, according to an exemplary embodiment.

In this exemplary embodiment, a magnetic resonance signal is obtained with respect to two slices.

In operation 410, a static magnetic field is generated in the imaging region, i.e. the bore 158, of the magnet assembly 150, in which a person 200 is placed. The static magnetic field is generated by applying current to the main magnet 151 wound around the bore. Generally, the direction of the static magnetic field is parallel to the axis z of the magnet assembly 150, and atomic nuclei of the atoms of the person 200 are arranged in the direction of the static magnetic field and perform precession about the direction of the static magnetic field.

In operation 420, magnetic field gradients are formed in the generated static magnetic field. The magnetic field gradients are generated by the gradient coil assembly 152. When x, y, and z axes are set in a 3D space, as described above with reference to FIG. 3, a magnetic field gradient generated along the z axis is used in slice selection, a magnetic field gradient generated along the x axis is used in frequency encoding, and a magnetic field gradient generated along the y axis is used in phase encoding.

The gradient coil assembly 152 is connected to the gradient controller 130 which applies a drive signal to the gradient coil assembly 152 according to a control signal received from the pulse sequence controller 122 to generate the magnetic field gradients. The gradient coil assembly 152 includes three coils corresponding to the x, y, and z axes to generate the magnetic field gradients along the respective axes. The gradient controller 130 may include three driving circuits corresponding to the three gradient coils of the gradient coil assembly 152.

In operation 430, a first RF pulse having a first center frequency $f_0$ is applied to a first slice. The position of the first slice is chosen based on the first center frequency $f_0$. The RF pulse is applied to excite the atomic nuclei of the person 200 by the RF coil assembly 153. The RF coil assembly 153 is connected to the RF transmitter 140 which applies a drive signal to the RF coil assembly 153 according to a control signal received from the pulse sequence controller 122 to transmit an RF excitation signal, i.e., an RF pulse.

In operation 440, a second RF pulse having a first center frequency $f_0$ is applied to the first slice. In an exemplary embodiment, the spin echo pulse sequence is used to obtain a magnetic resonance signal from atomic nuclei, in which a first RF pulse is applied, and then a second RF pulse is applied after the lapse of a time equal to TE/2.

When the time equal to TE lapses after the first RF pulse is applied, a magnetic resonance signal is generated from the atomic nuclei of the first slice.

In operation 450, the receive coil of the RF coil assembly 153 receives the magnetic resonance signal and stores the received magnetic resonance signal in the data storage 170 as data. The RF coil assembly 153 is connected to the RF receiver 160. The preamplifier of the RF receiver 160 amplifies the magnetic resonance signal received by the receive coil of the RF coil assembly 153, the phase detector of the RF receiver 160 detects a phase of the magnetic resonance signal received from the preamplifier, and the A/D converter of the RF receiver 160 converts an analog signal acquired by phase detection into a digital signal. The digital signal is stored in the data storage 170.

In operation 460, a first RF pulse having a second center frequency $f_0+f_{s1}$ is applied to a second slice. The position of the second slice is determined by the second center frequency $f_0+f_{s1}$. If $f_{s1} \geq \Delta f$, a magnetic resonance signal may be obtained with respect to the second slice region which does not overlap the first slice region. For example, if $f_{s1}=\Delta f+f_{gap}$, a slice gap of $z_{gap}=2\pi f_{gap}/(\gamma G_z)$ may be secured.

In operation 470, a second RF pulse having a third center frequency $f_0-f_{s1}$ is applied to the second slice. Consequently, the slice regions selected by the on-resonance components when the first RF pulse and the second RF pulse are applied are prevented from being different from each other.

In operation 480, a magnetic resonance signal generated from the atomic nuclei of the second slice is received and stored in the data storage.

FIG. 12 is a flowchart illustrating a process of generating magnetic field gradients, according to an exemplary embodiment in detail.

In operation 510, a static magnetic field is generated in the bore 158 of the magnet assembly 150 similarly to what is described above with reference to FIG. 11.

In operation 520, a first gradient is applied to the generated static magnetic field to generate a magnetic field gradient. For example, the first gradient is a magnetic field gradient when a first RF pulse is applied. As the first gradient has a greater size, a thinner slice may be selected.

In operation 530, a first RF pulse having a first center frequency $f_0$ is applied to a first slice, similarly to operation 430 of FIG. 11, and therefore, a description thereof is omitted.

In operation 540, a second gradient having a polarity opposite to that of the first gradient formed in the static magnetic field, when a time equal to about TE/2 lapses after the first RF pulse is applied. In the same manner as the first gradient, the second gradient is a magnetic field gradient when a second RF pulse is applied. When the first gradient and the second gradient have opposite polarities, the slices selected by on-resonance components when the first RF pulse and the second RF pulse are applied are prevented from being different from each other, and a static magnetic field is obtained with respect to a desired slice without interference with off-resonance components.

In operation 550, a second RF pulse having a first center frequency $f_0$ is applied to the first slice.

In operation 560, a magnetic resonance signal from the atomic nuclei of the first slice region is received, digitized, and stored in the data storage.

In operation 570, a first gradient is applied to the static magnetic field to obtain a magnetic resonance signal with respect to a second slice. The first gradient with respect to the second slice may be identical to the first gradient with respect to the first slice.

In operation 580, a first RF pulse having a second center frequency $f_0+f_{s1}$ is applied to the second slice.

In operation 590, a second gradient having a polarity opposite to that of the first gradient is applied to the static magnetic field, when the time equal to about TE/2 lapses after the first RF pulse is applied.

In operation 600, a second RF pulse having a third center frequency $f_0-f_1$ is applied to the second slice.

In operation 610, a magnetic resonance signal generated from the atomic nuclei of the second slice is received, when the time equal to TE/2 lapses after the second RF pulse is applied. The magnetic resonance signal is digitized and stored in the data storage 170.

Upon completing storage of data in the data storage 170, the data processor 180 forms magnetic resonance images of the first slice and the second slice using the data and displays the formed magnetic resonance images on the display 190.

In the flowcharts of FIGS. 11 and 12, the magnetic field gradients are described as generated before the RF pulses are applied for the sake of convenience. However, formation of the magnetic field gradients and application of the RF pulses are simultaneously performed, as shown in the pulse sequence diagrams of FIGS. 4 and 6.

In an exemplary embodiment of FIGS. 11 and 12, magnetic resonance signals are obtained with respect to two slices. Alternatively, magnetic resonance signals may be obtained with respect to n slices, where n>2, through single scanning while changing central frequencies.

In the above-described magnetic resonance imaging apparatus 100 according to an exemplary embodiment and the control method thereof, a plurality of slice images is obtained through single scanning, and the obtained slice images do not interfere with off-resonance components. Consequently, a user may adjust a center frequency of each slice to obtain a magnetic resonance signal with respect to a desired slice.

Accordingly, in exemplary embodiments, magnetic resonance images, from which errors due to the off-resonance components are corrected, may be obtained with respect to multiple slices.

Also, when the magnetic resonance images are obtained for the multiple slices, overlap between the magnetic resonance images may be prevented, and a user may adjust a center frequency of each RF pulse to obtain magnetic resonance signals with respect to slices at desired imaging positions and in desired imaging order.

The foregoing exemplary embodiments and advantages are merely exemplary and are not to be construed as limiting. The present teaching can be readily applied to other types of apparatuses. Also, the description of the exemplary embodiments is intended to be illustrative, and not to limit the scope of the claims, and many alternatives, modifications, and variations will be apparent to those skilled in the art.

What is claimed is:

1. A magnetic resonance imaging apparatus comprising:
   a main magnet which generates a static magnetic field in an imaging region;
   gradient coils which form magnetic field gradients in the static magnetic field;
   a radio frequency (RF) coil assembly which applies a first RF pulse and a second RF pulse to n (n≥2) slice regions located at different positions in the imaging region to excite atomic nuclei of the slice regions; and
   a controller which controls the RF coil assembly to apply the first RF pulse and the second RF pulse having a first center frequency $f_0$ to a first slice region of the slice regions, to apply the first RF pulse having a second center frequency $f_0+f_s$ to a second slice region of the slice regions, and to apply the second RF pulse having a third center frequency $f_0-f_s$ to the second slice region, so that each of the second center frequency and the third center frequency applied to the second slice region is shifted from the first center frequency by a quantity $f_s$,
   wherein the controller is configured to adjust the quantity $f_s$ to obtain a desired slice gap between the first and second slice regions.

2. The magnetic resonance imaging apparatus according to claim 1, wherein the controller controls the gradient coil assembly to form a first gradient in the static magnetic field upon applying the first RF pulse, and
   form a second gradient having a polarity opposite to that of the first gradient in the static magnetic field upon applying the second RF pulse.

3. The magnetic resonance imaging apparatus according to claim 1, wherein the controller controls the RF coil assembly to adjust the second center frequency and the third center frequency to control an imaging order of the slice regions.

4. The magnetic resonance imaging apparatus according to claim 1, wherein the controller controls the RF coil assembly so that the first and second RF pulses have the same bandwidth with respect to the respective first and second slice regions.

5. The magnetic resonance imaging apparatus according to claim 4, wherein the controller controls the RF coil assembly so that the quantity $f_s$ is equal to or greater than the bandwidth.

6. The magnetic resonance imaging apparatus according to claim 5, wherein the quantity $f_s$ is greater than the bandwidth by a gap frequency $f_{gap}$, and
   the controller controls the RF coil assembly to adjust the gap frequency $f_{gap}$ to obtain the desired slice gap.

7. The magnetic resonance imaging apparatus of claim 1, wherein the first RF pulse is a 90° pulse and the second RF pulse is a 180° pulse.

8. A control method of a magnetic resonance imaging apparatus to acquire a magnetic resonance signal with respect to n (n≥2) slice regions located at different positions in an imaging region, the control method comprising:
   generating a static magnetic field in the imaging region;
   forming magnetic field gradients in the static magnetic field;
   applying a first RF pulse having a first center frequency $f_0$ to a first slice region of the slice regions;
   applying a second RF pulse having the first center frequency $f_0$ to the first slice region; and
   applying the first RF pulse having a second center frequency $f_0+f_s$ to a second slice region of the slice regions, and the second RF pulse having a third center frequency $f_0+f_s$ to the second slice region, so that each of the second center frequency and the third center frequency applied to the second slice region is shifted from the first center frequency by a quantity $f_s$,
   wherein the quantity $f_s$ is adjusted to obtain a desired slice gap between the first and second slice regions.

9. The control method according to claim 8, wherein the forming the magnetic field gradients in the static magnetic field comprises:

forming a first magnetic field gradient in the static magnetic field upon applying the first RF pulse; and forming a second magnetic field gradient having a polarity opposite to that of the first gradient in the static magnetic field upon applying the second RF pulse.

10. The control method according to claim 8, wherein the second center frequency and the third center frequency are adjusted to control an imaging order of the slice regions.

11. The control method according to claim 8, wherein the first and second RF pulses have the same bandwidth with respect to the first and second slice regions.

12. The control method according to claim 11, wherein the quantity $f_s$ is equal to or greater than the bandwidth.

13. The control method according to claim 12, wherein the quantity $f_s$ is greater than the bandwidth by a gap frequency $f_{gap}$, and the gap frequency $f_{gap}$ is adjusted to obtain the desired slice gap.

14. The control method of claim 8, wherein the first RF pulse is a 90° pulse and the second RF pulse is a 180° pulse.

15. A magnetic resonance imaging (MRI) apparatus comprising:

a main magnet which generates a static magnetic field in an imaging region;

gradient coils which form magnetic field gradients in the static magnetic field;

a radio frequency (RF) coil assembly which transmits RF pulses to slice regions disposed along z-axis in the imaging region;

a processor which is programmed to form a first magnetic field gradient of a first polarity, when transmitting a first RF pulse having a first center frequency $f_0$ to a first slice region, to form a second magnetic field gradient of a second polarity opposite to the first polarity, when transmitting a second RF pulse having the first center frequency $f_0$ to the first slice region, and generate magnetic resonance (MR) data of a first slice selected by the first RF pulse the second RF pulse, while excluding the MR data generated by an off-resonance signal; and a display which displays an image generated based on the MR data, wherein the processor is further programmed to form the first magnetic field gradient of the first polarity when transmitting the first RF pulse having a second center frequency $f_1$ to a second slice region, form the second magnetic field gradient of the second polarity when transmitting the second RF pulse having a third center frequency $f_2$ to the second slice region, and generate the MR data of a selected second slice while excluding the MR data generated by the off-resonance signal, wherein each of the second center frequency and the third center frequency applied to the second slice region is shifted from the first center frequency by a frequency shift $f_s$, and the processor is programmed to adjust the frequency shift $f_s$ to obtain a desired slice gap between the first and second slice regions.

16. The MRI apparatus of claim 15, wherein an off-resonance frequency is $f_{off}$, and a bandwidth $\Delta f$ of the first center frequency is selected so that $\Delta f/2$ is greater than $f_{off}$.

17. The MRI apparatus of claim 15, wherein the second center frequency $f_1$ is greater than the first center frequency $f_0$ by the frequency shift $f_s$, and the third center frequency $f_2$ is less than the first center frequency $f_0$ by the frequency shift $f_s$.

18. The MRI apparatus of claim 17, wherein a bandwidth of the second center frequency is equal to that of the third center frequency, and the processor is further programmed to select the frequency shift $f_s$ to be greater than the bandwidth, and generate non-overlapping sets of the MR data for the first slice region and the second slice region.

* * * * *